US012696581B2

(12) United States Patent
Pinos et al.

(10) Patent No.: US 12,696,581 B2
(45) Date of Patent: Jul. 28, 2026

(54) HIGH RESOLUTION MONOLITHIC RGB ARRAYS

(71) Applicant: PLESSEY SEMICONDUCTORS LTD, Plymouth (GB)

(72) Inventors: Andrea Pinos, Plymouth (GB); Simon Ashton, Plymouth (GB); Xiang Yu, Plymouth (GB); Jonathan Shipp, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 863 days.

(21) Appl. No.: 17/799,685

(22) PCT Filed: Feb. 15, 2021

(86) PCT No.: PCT/GB2021/050363
§ 371 (c)(1),
(2) Date: Aug. 14, 2022

(87) PCT Pub. No.: WO2021/165659
PCT Pub. Date: Aug. 26, 2021

(65) Prior Publication Data
US 2023/0069410 A1 Mar. 2, 2023

(30) Foreign Application Priority Data
Feb. 19, 2020 (GB) ..................................... 2002259

(51) Int. Cl.
*H10H 20/812* (2025.01)
*H10H 20/825* (2025.01)
*H10H 20/831* (2025.01)

(52) U.S. Cl.
CPC ........ *H10H 20/812* (2025.01); *H10H 20/825* (2025.01); *H10H 20/8312* (2025.01)

(58) Field of Classification Search
CPC .. H10H 20/83; H10H 20/831; H10H 20/8312; H10H 20/832; H10H 29/032;
(Continued)

(56) References Cited

U.S. PATENT DOCUMENTS 5,003,359 A 3/1991 Abeles
2015/0279903 A1 10/2015 Mandl et al.
(Continued)

FOREIGN PATENT DOCUMENTS

EP 0487192 A2 5/1992
JP S63107076 A 5/1988
(Continued)

OTHER PUBLICATIONS

International Search Report in PCT International Application No. PCT/GB2021/050363, Aug. 26, 2021.
(Continued)

*Primary Examiner* — Thanhha S Pham
(74) *Attorney, Agent, or Firm* — Cognition IP, P.C.; Edward Steakley

(57) ABSTRACT

A light emitting diode structure comprising a p-type region an n-type region; and a light emitting region for recombination of carriers injectable by the p-type region and the n-type region, wherein at least one of the n-type region and the p-type region is at least partially formed in a via passing through the light emitting region, wherein the via defines the perimeter of a light emitting surface of at least one pixel.

19 Claims, 12 Drawing Sheets

(58) Field of Classification Search
    CPC .. H10H 29/832; H10H 20/032; H10H 20/042;
                H10H 20/0364; H10H 20/81; H10H
            20/811; H10H 20/812; H10H 20/8131;
            H10H 20/813; H10H 20/8132; H10H
            29/14; H10H 29/142; H10H 29/962;
                                        H10H 29/10
    See application file for complete search history.

(56)                    References Cited

U.S. PATENT DOCUMENTS

| | | | |
|---|---|---|---|
| 2019/0198561 | A1 | 6/2019 | Wildeson et al. |
| 2019/0333455 | A1 | 10/2019 | El-Ghoroury |
| 2022/0262979 | A1* | 8/2022 | Herrmann ............ H10H 20/813 |

FOREIGN PATENT DOCUMENTS

| | | | |
|---|---|---|---|
| JP | 2012522273 | A | 9/2012 |
| JP | 2015508941 | A | 3/2015 |
| JP | 2016-4942 | A | 1/2016 |
| JP | 2019526925 | A | 9/2019 |
| KR | 20080062962 | A | 7/2008 |
| WO | 2019/091895 | A1 | 5/2019 |

OTHER PUBLICATIONS

Office Action received in counterpart Korean application No. 10-2022-7031512, mailed on Oct. 1, 2025.

* cited by examiner

200

114
112
110
116

206
116
204

108

115

202

106
104

115

102

210

200'

210

208

116

HIGH RESOLUTION MONOLITHIC RGB ARRAYS

CROSS-REFERENCE TO RELATED APPLICATIONS

This application is a 35 U.S.C. § 371 national stage application of PCT International Application No. PCT/GB2021/050363, filed on Feb. 15, 2021, which claims the benefit of Great Britain Application No. 2002259.6, filed Feb. 19, 2020, which are hereby incorporated by reference in their entirety.

FIELD OF THE INVENTION

The invention relates to light emitting diode structures and methods of forming light emitting diode structures. In particular, but not exclusively, the invention relates high resolution monolithic arrays of light emitting diode structures.

BACKGROUND OF THE INVENTION

Conventional red-green-blue (RGB) micro light emitting diode (μLED) arrays of light emitting pixels are typically achieved using pick-and-place techniques, or by the use of colour conversion material deposited or integrated into standard planar LED structures. However, as the pixel pitch in such arrays is reduced to very small pitches (e.g., less than 5 μm) in order to provide higher resolution arrays, a number of difficulties arise.

For example, the use of pick-and-place can be impractical due to high cost, low throughput and the limit of positional accuracy when transferring the μLEDs. In the case of colour conversion, the use of such a technique is limited by the phosphor size used for colour conversion, which is typically greater than 10 μm (i.e., greater than the pixel pitch in arrays with very small pitches needed for higher resolutions). Further, colour conversion techniques may be subject to poor reliability and inefficiencies due to small absorption coefficients associated with quantum dots (QDs). For example, thicknesses of colour-converting QD material in excess of 10 μm are needed fully to absorb the blue emission exciting them, thus making them unsuitable for very small pixel pitch arrays.

In order to avoid having to transfer LEDs, and in order to provide high-quality efficient emission, it would be beneficial to provide a native array of LEDs on the same substrate. One approach for building a native array of LEDs on the same substrate relies on selective area growth of nanowires, which are arrays of individual structures that are grown substantially perpendicular to a patterned growth substrate to form light emitting structures where the light emitting surface is defined by the cross-sectional area of the nanowire using typical epitaxial quantum well structures grown between epitaxial n-type and p-type doped layers. However, the growth of such nanowires is generally difficult to control and may be subject to severe limitations in the light efficiency and colour gamut achievable due to poor light extraction efficiency and impurity incorporation, for example.

SUMMARY OF THE INVENTION

In order to mitigate for at least some of the above-described problems, there is provided a light emitting diode structure in accordance with the appended claims. Further, there is provided an array of light emitting diode structures and method of forming one or more light emitting diode structures in accordance with the appended claims.

In an example there is provided a light emitting diode structure comprising: a p-type region; an n-type region; and a light emitting region for recombination of carriers injectable by the p-type region and the n-type region, wherein at least one of the n-type region and the p-type region is at least partially formed in a via passing through the light emitting region, wherein the via defines the perimeter of a light emitting surface of at least one pixel. Advantageously, the very material used to inject carriers into the light emitting region is also used to define the perimeter of the light emitting surface of at least one pixel, isolating the pixel whilst still providing a source of carriers that enables efficient recombination of and light emission across the light emitting surface for the pixel.

Preferably, the light emitting region comprises at least one epitaxial quantum well layer. Advantageously, epitaxial quantum well layers are grown with high crystalline quality, leading to efficient light generation.

Preferably, the via enables lateral carrier injection in the light emitting region. Advantageously, lateral carrier injection into one or more quantum wells in the light emitting region accomplishes more efficient hole injection in to the light emitting region.

Preferably, both the n-type region and the p-type region are at least partially formed in vias passing through the light emitting region. Advantageously, such an arrangement enables lateral carrier injection from both the n-type region and the p-type region, leading to efficient recombination. Beneficially, the very regions used for lateral carrier injection are also used to isolate pixels.

Preferably, the light emitting diode structure comprises a further via, wherein the via and the further via are arranged to provide an anode and a cathode. Advantageously, such an arrangement enables lateral carrier injection from both the n-type region and the p-type region, leading to efficient recombination. Beneficially, the very regions used for lateral carrier injection are also used to isolate pixels. Additionally, the anode and cathode can be energised selectively in order to control light emission form the light emitting diode structure.

Preferably, the light emitting diode structure comprises a further light emitting region. Advantageously, the light emitting regions can be energised simultaneously or individually and may be configured to have the same or different primary peak wavelengths.

Preferably, the light emitting region and the further light emitting region are separated by an undoped region thereby to provide a stack of light emitting regions. Advantageously, carrier injection into the different light emitting regions is achieved by forming via connections to the light emitting regions without the need of a laminated n-GaN and p-GaN stack, as seen in conventional LED structures. Beneficially, in the absence of p-type doping layers there is no issue with p-type dopant diffusion and the multiple quantum wells (MQWs) of the light emitting regions can be closer together with no need for a tunnel junction. Further, no electron blocking layers are needed in the structure.

Preferably, the via passes through both the light emitting region and the further light emitting region. Advantageously, a common connection is provided for the light emitting regions, resulting in simpler processing of an initial epitaxial structure.

Preferably, the light emitting region and the further light emitting region are configured to emit light of different wavelengths. Advantageously, light of different primary peak wavelengths can be emitted by the structure and the structure can be implemented in a multi-colour array.

Preferably, the light emitting region and the further light emitting region are arranged such that the surface areas of the light emitting region and further light emitting region partially overlap. Advantageously, in plan view, there are different regions arranged to provide light emitting surfaces that are based on different light emitting regions (and can thus be configured to provide different light emission, be it different intensity, timing or colour, etc., for example).

Preferably, the light emitting diode structure comprises at least three light emitting regions, wherein one of the light emitting regions emits blue light, one of the light emitting regions emits green light and one of the light emitting regions emits red light. Advantageously, the use of three light emitting region provides increased flexibility, including the ability to provide red-green-blue (RGB) light, at high resolution, for colour displays.

Preferably, the via is a grid via defining an array comprising a plurality of pixels, preferably wherein the grid is arranged to provide a common electrode. Advantageously, connection can be made in one process step. Further, the use a grid via defining pixels means that no electrical isolation etch between pixels is needed, allowing for tighter pixel integration.

Preferably, at least two pixels are configured to emit light of different wavelengths. Advantageously, multiple colour outputs can be provided from a monolithic array.

Preferably, the further via comprises a columnar via and the n-type or p-type region is formed in the further via. Advantageously, the columnar via provides an efficient means to provide carrier injection.

Preferably, the columnar via is arranged to provide an electrode thereby to enable control of emission in a pixel defined by the via. Advantageously, the electrode can be used to selectively control emission from an individual pixel in a high resolution array of pixels.

Preferably, the light emitting region and/or further light emitting region is formed on an undoped epitaxial layer. Advantageously, the undoped epitaxial layer allows for electrical isolation of the pixel.

Preferably, the light emitting region and/or further light emitting region is formed between undoped epitaxial layers. Advantageously, the undoped epitaxial layers allow for electrical isolation of pixels, as well as enabling processing of epitaxial structures for individual pixel connection by etching through the light emitting region and/or further light emitting region formed between undoped epitaxially layers.

Preferably, the undoped epitaxial layer is formed on a barrier layer configured to block vertical carrier diffusion. Advantageously, the light emitting structure can be formed on doped material that may form part of the substrate and/or preferable growth techniques, whilst enabling isolation of the light emitting region such that one of the n-type and p-type regions is formed to pass through the light emitting region.

Preferably, the light emitting diode structure is a gallium nitride based structure. Gallium nitride is known for its properties in providing efficient light emitting diode devices with a range of primary peak wavelengths. The growth of gallium nitride structures is well developed and the growth and processing of such materials is controllable to provide high quality devices. Accordingly, preferably the undoped epitaxial layer is gallium nitride.

Preferably, the barrier layer is AlGaN. Advantageously, the barrier provides a stable surface for subsequent processing steps.

Preferably, at least one of the n-type region and the p-type region is formed in a via that is connected to a planar n-type region or a planar p-type region respectively.

Advantageously, the use of a planar region provides for light emission due to carrier diffusion and may be advantageous to reduce etch damage and loss of active region where a central via etch would otherwise be used for lateral injection of carriers into the light emitting region.

Preferably, the n-type region is formed in the via by selected area growth of n-type material. Advantageously, the selected area growth at least partially cures etch damage. Further, passivation is unnecessary as there are no remaining open surfaces cutting through the multiple quantum wells.

Preferably, the p-type region is formed in the via by selected area growth of p-type material. Advantageously, the selected area growth at least partially cures etch damage. Further, passivation is unnecessary as there are no remaining open surfaces cutting through the multiple quantum wells.

Preferably, the via is an etched via. Techniques for anisotropic etching are known and enable larger scale epitaxial structures to be grown and subsequently processed in order to provide light emitting diode structures that have pixel perimeters defined by the etched via(s). This means that known techniques for growing high quality and efficient epitaxial structures can be used, as opposed to smaller scale techniques such as patterned nanowire growth.

Preferably, the light emitting surface has an area based on the diffusion length of carriers within the light emitting region. Advantageously, the light emitting surface shape and/or size is optimisable based on the diffusion carrier length, which is useful to provide uniform light emission in micro LEDs.

Preferably, the light emitting surface area is less than or equal to 100 $\mu m^2$, and preferably less than or equal to 16 $\mu m^2$. Advantageously, the definition of pixels using a via comprising n-type or p-type material enables the formation of micro LEDs having light emitting surfaces providing pixels with a high resolution.

Advantageously, the definition of pixels using a via comprising n-type or p-type material enables the formation of micro LEDs having light emitting surfaces providing pixels with a high resolution that can be formed into an array. Such an array is suitable for connection to a backplane and hence integration into high resolution displays or other high resolution arrays that may be monochromatic array or multicolour.

Preferably, the light emitting diode structure and/or array of micro LEDs is provided by forming a plurality of epitaxial layers on a substrate. Advantageously, forming a plurality of epitaxial layers on a substrate means that high quality structures can be provided in continuous growth, thereby to reduce growth time and impurities in the growth.

Preferably, the plurality of epitaxial layers comprises the n-type region and the light emitting region. Advantageously, such a plurality of epitaxial layers comprises layers of a conventional LED structure. Beneficially, conventional LED structures (which may be terminated before the p-cladding) can be used as a basis for the subsequent processing of monolithic micro LED arrays.

Preferably, the plurality of epitaxial layers are etched, such that the etching passes through the light emitting region to provide the via defining the pixel perimeter. Techniques for anisotropic etching are known and enable larger scale epitaxial structures to be grown and subsequently processed in order to provide light emitting diode structures that have pixel perimeters defined by the etched via(s). This means that known techniques for growing high quality and efficient epitaxial structures can be used, as opposed to smaller scale techniques such as patterned nanowire growth.

Preferably, the p-type region or n-type region is grown in the etched via.

Preferably, a further via is etched for the p-type region or the n-type region.

Preferably, the further via passes through an light emitting region configured to provide a particular wavelength.

Preferably, a yet further via for the p-type region or the n-type region is etched, wherein the further via and the yet further via are arranged to allow carrier injection in different light emitting regions, thereby to provide light of different wavelength.

Preferably, the etching a yet further via for the p-type region or the n-type region comprises at least partially etching through at least one light emitting region in order locally to remove an unwanted longest wavelength.

Further aspects of the invention will be apparent from the description and the appended claims.

DETAILED DESCRIPTION OF AN
EMBODIMENT OF THE INVENTION

A detailed description of embodiments of the invention is described, by way of example only, with reference to the figures, in which.

6

Figure 12A:
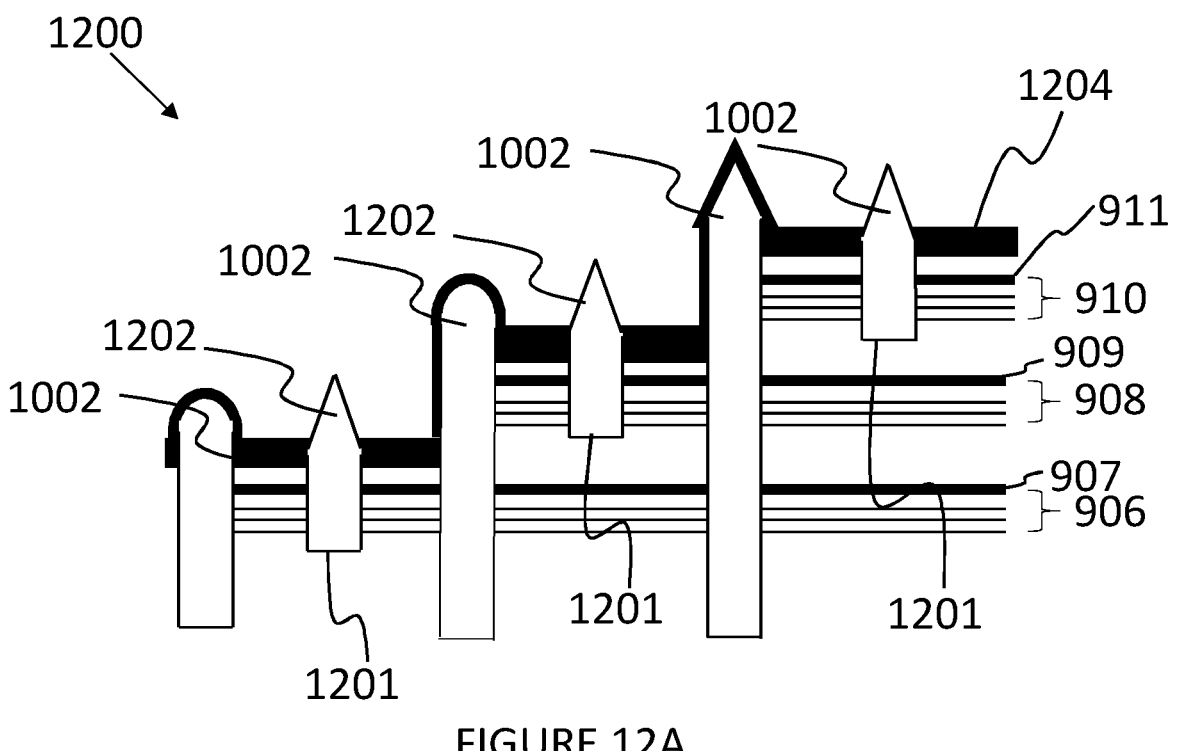
FIG. 12A shows a light emitting structure having three different light emitting regions.
Figure 13A:
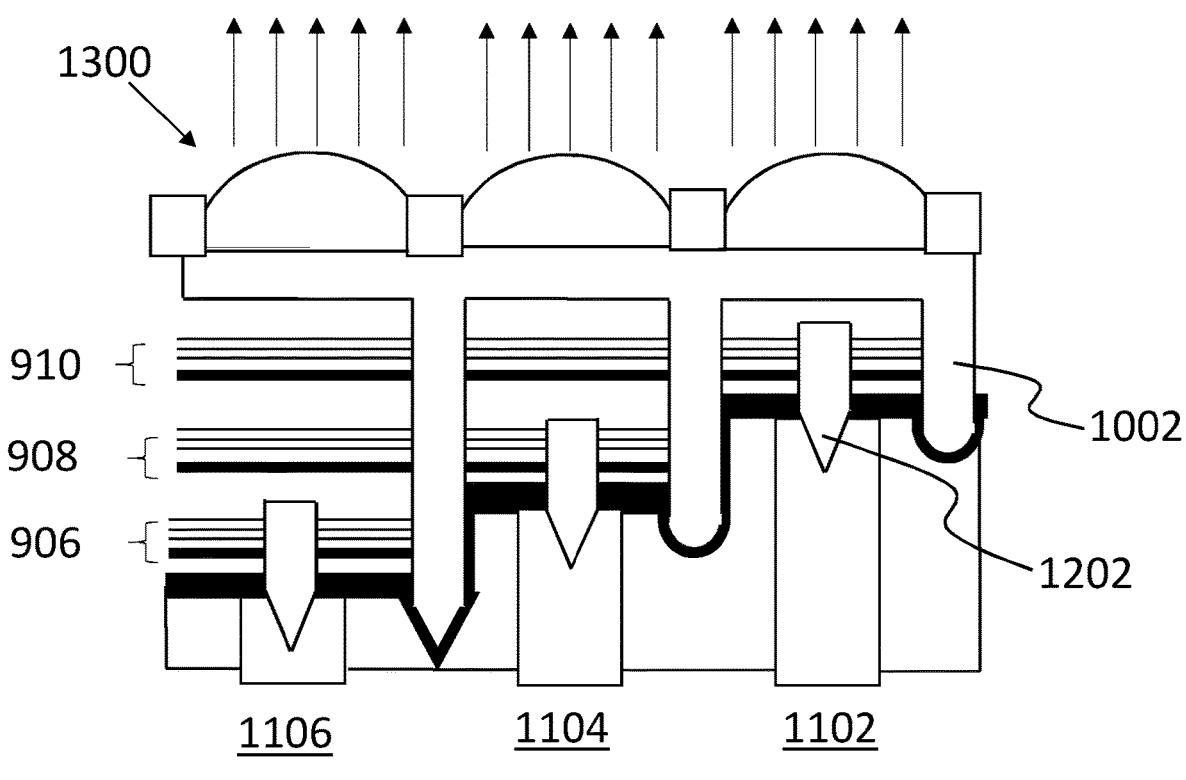
Figure 13B:
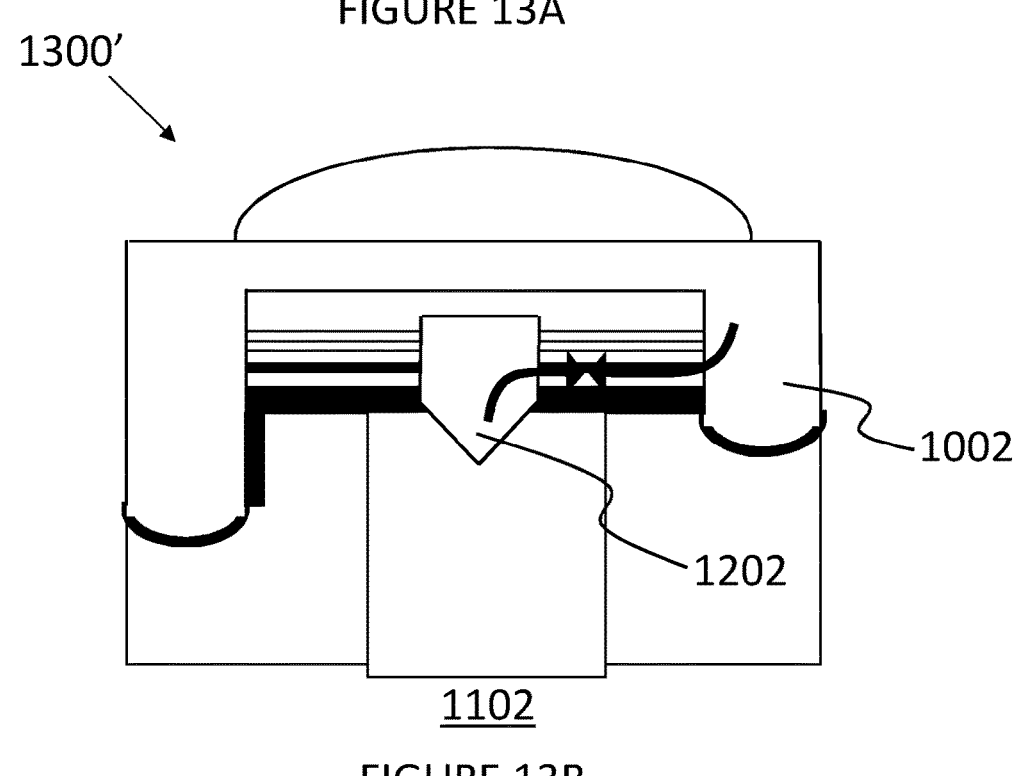
Figure 14:
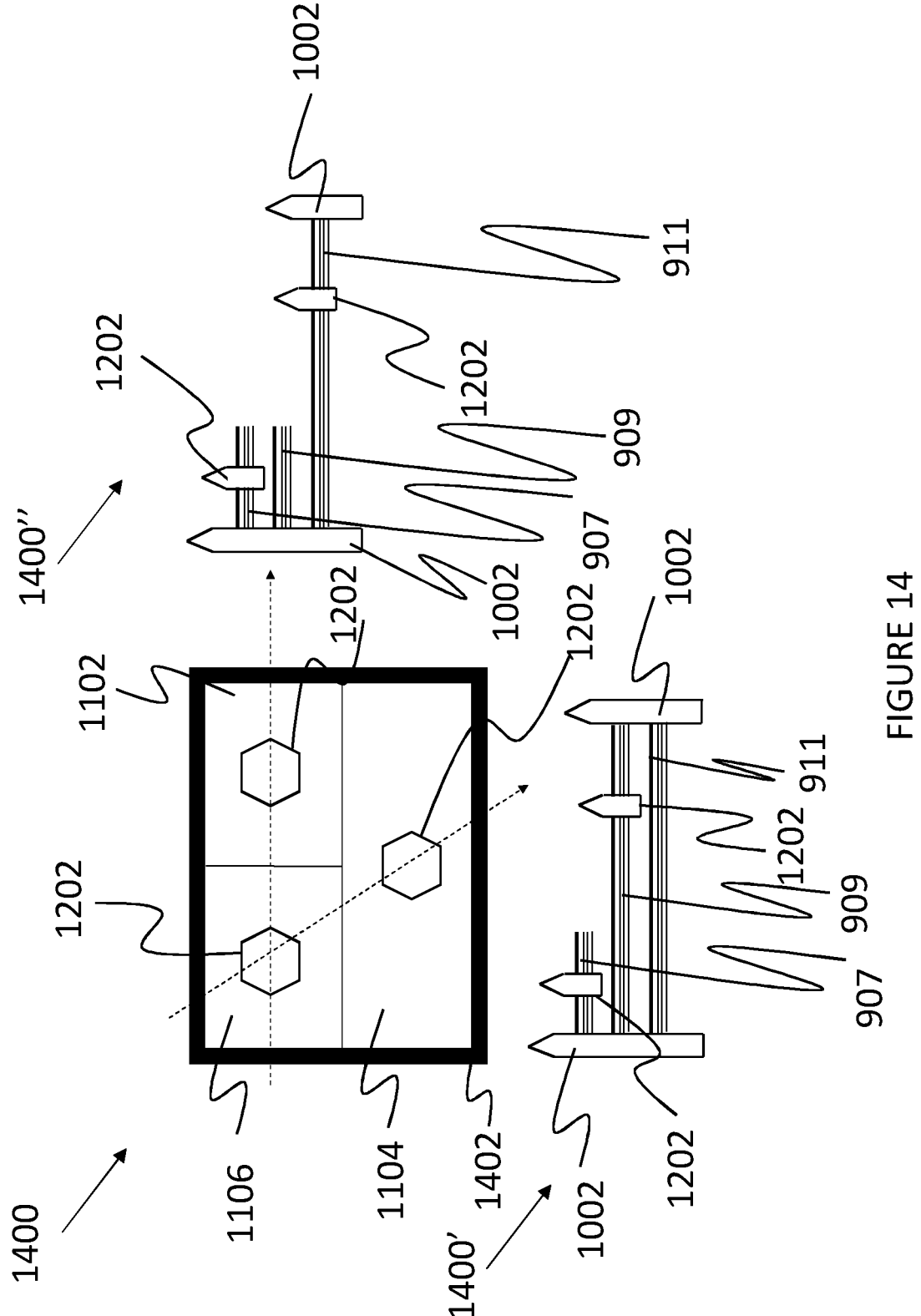

FIG. 13A shows a processed light emitting structure of FIG. 12A;

FIG. 13B shows lateral carrier injection in the structure of FIG. 13A; and FIG. 14 shows an implementation of a pixel with three different light emitting regions within a pixel defined by a perimeter formed by a via passing through the light emitting regions.

Light emitting diodes (LEDs) are typically formed by processing light emitting structures that have been grown by the formation of epitaxial crystalline layers on relatively large wafer substrates in a reactor, such as an MOCVD (metalorganic chemical vapour deposition) reactor, MBE (molecular beam epitaxy) reactor or other chemical vapour deposition reactor, for example. For the reasons described above, known methods for creating arrays of high resolution micro-LEDs face difficulties in the processing of LEDs produced by crystalline growth on relatively large wafer substrates to provide micro-LEDs for high resolution arrays. The use of nanowire LED arrays to overcome these processing problems leads to difficulties in control of the growth process as well as generally poorer performance than is seen from conventional relatively large wafer substrate growth of LEDs.

The present disclosure describes micro-LEDs formed as part of a monolithic high resolution array by, advantageously, processing light emitting structures that can be grown on relatively large wafer substrates. Beneficially, compared with colour converted pixels, native colour pixels can be formed that are smaller, more efficient and more resistant to degradation. Compared with pick-and-place assembly, processing of epitaxial structures grown directly on a wafer means that there is no requirement to transfer millions of pixels (and associated failure in the transfer process) and thus there is higher throughput by forming arrays of pixels on wafers. Compared with nanowires, the processing of standard planar epitaxial deposited layer growth means that multiple quantum wells (MQWs) are formed in a way that provides high quality growth and hence relatively high internal quantum efficiency (IQE). Further, the processing of epitaxial structures provides planar devices that better lend themselves to light extraction using standard surface patterning techniques.

Further advantages arising from the described method and structure will be apparent in the following description. Methods of providing arrays of micro LEDs are described below with reference to various processing steps (the processing steps may include steps performed both in a growth reactor and outside a growth reactor, using other processing and/or growth equipment). The methods and structures are described with reference to III-V semiconductor materials. In particular, the methods and structures are described with reference to Nitride structures, including Gallium Nitride (GaN) based light emitting structures, which are well known to provide relatively high efficiency light emitting structures. However, in further examples, the methods and structures are applicable to light emitting structures based on other materials, in particular based on other semiconductor materials.

In the following figures, like reference numerals are used in order to illustrate aspects of the structures that relate to the same features, or equivalent features provided by the same, or similar, processes.

Figures 1A, 1B, 1C:
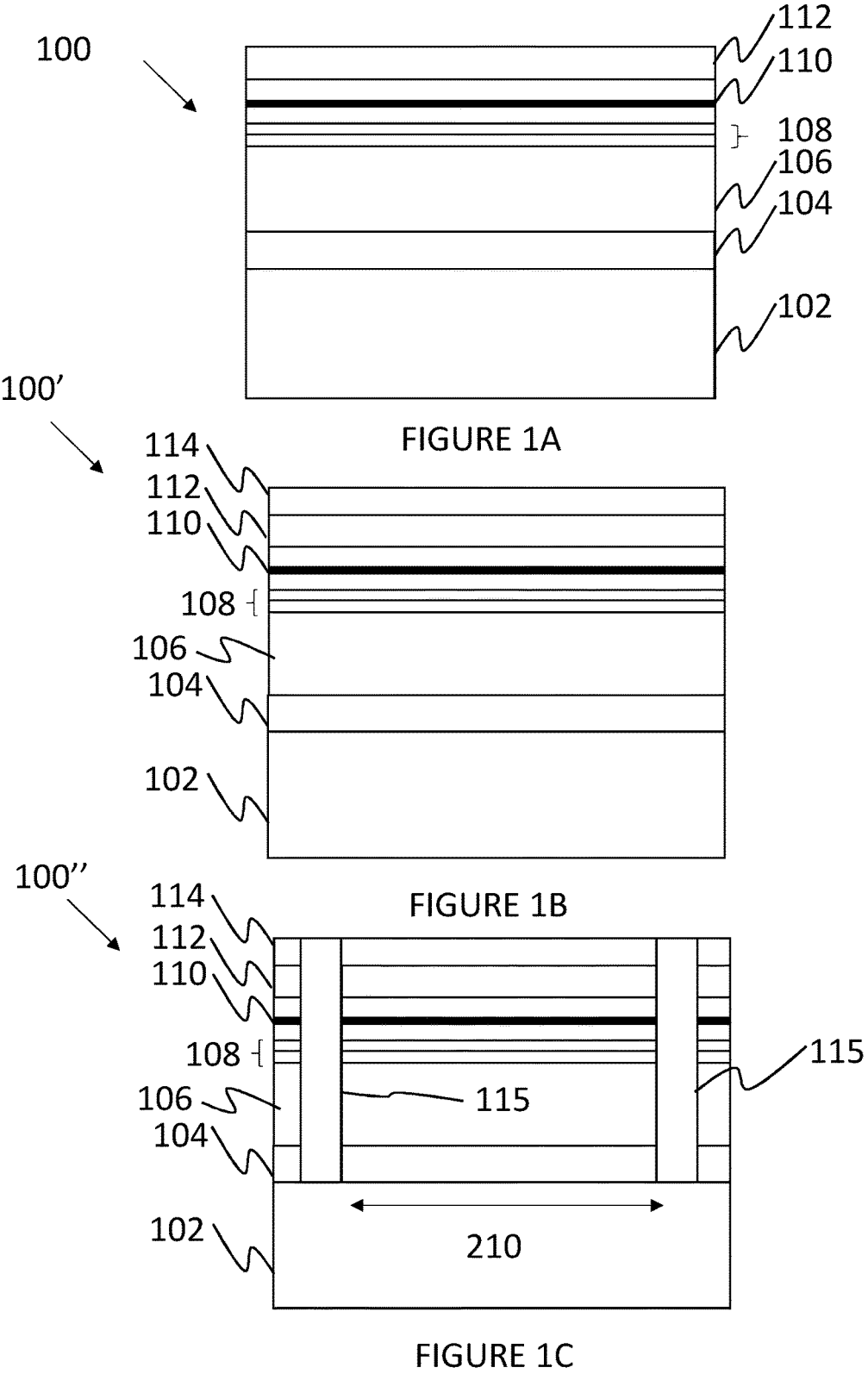
FIG. 1A shows a cross sectional view of an epitaxial structure.
FIG. 1B shows a cross sectional view of a processed epitaxial structure.
FIG. 1C shows a cross sectional view of a processed epitaxial structure.

FIG. 1A shows a cross-sectional portion of a structure 100 that is an epitaxial structure 100 that forms the basis of a monochrome micro LED pixel array. Such a monochrome micro LED pixel array has a plurality of individual pixels, where each pixel may be individually addressable based on the way such monochrome micro LED pixel array is connected to a power source (e.g., depending on the arrangement of a backplane with respect to the micro LED pixel array).

The structure 100 is a GaN-based epitaxial multiple quantum well (MQW) structure, grown by metalorganic chemical vapour deposition (MOCVD), that is effectively an LED structure that has been grown and terminated before the p-cladding that would otherwise provide a conventional p-n junction sandwiching a light emitting region formed to include at least one or more quantum wells. Beneficially, known techniques can be used to provide high quality material that can be processed in order to provide a monolithic high resolution micro LED array.

In FIG. 1A there is shown an n-doped (n-GaN) n-type region 102 upon which an AlGaN barrier layer 104, with 10% Aluminium, is grown. The n-type region 102 is typically formed on a substrate (not shown). The AlGaN barrier layer 104 prevents vertical carrier diffusion from the n-type region 102.

An undoped region 106 (GaN that is not intentionally doped) is grown on the barrier layer 104, and a GaN-based superlattice structure 108 is grown upon the undoped region 106. On top of the superlattice structure 108 there is a light emitting region 110 having multiple quantum wells (MQWs). The n-type region 102, the barrier layer 104, the undoped region 106, the superlattice 108 and the light emitting region 110 are shown in cross-section as a plurality of epitaxial layers grown on a substrate (the substrate not being shown to the extent that the substrate is not the n-type region 102 itself).

An undoped region 106 (GaN that is not intentionally doped) is grown on the barrier layer 104, and a GaN-based superlattice structure 108 is grown upon the undoped region 106. On top of the superlattice structure 108 there is a light emitting region 110 having multiple quantum wells (MQWs). The n-type region 102, the barrier layer 104, the undoped region 106, the superlattice 108 and the light emitting region 110 are shown in cross-section as epitaxial layers grown on a substrate (not shown).

The light emitting region 110 has MQWs. Additionally or alternatively, the light emitting region 110 may have a single quantum well (SQW). Additionally or alternatively, the light emitting region 110 may include one or more quantum dots or other structure to enable carrier combination and light emission. The quantum wells and quantum dots confine carriers and, in use, provide a source of light based on emissive carrier recombination in the quantum structures following carrier injection, for example by n-type and p-type regions when connected to a cathode and an anode, respectively.

A further barrier layer 112, which is an AlGaN barrier layer 112 is shown on top of the light emitting region 110. The barrier layer 112 provides a stable surface for the subsequent processing steps.

Whilst the barrier layer 112 is show to be an AlGaN barrier layer 112, additionally or alternatively, the barrier layer 112 is formed from a different material, or may be excluded.

Whilst the light emitting region 110 comprises MQWs, in further examples, the light emitting region 110 may have a single quantum well (SQW). The light emitting region 110 comprises multiple layers of material to form an active region. For example, the light emitting region 110 comprises layers such as a short period superlattice and/or an undoped recovery layer, thereby providing high quality crystalline material and emission from the light emitting region 110. Additionally or alternatively, the light emitting region 110 may include one or more quantum dots. The quantum wells and quantum dots confine carriers and, in use, provide a source of light based on carrier recombination in the quantum structures following carrier injection by n-type and p-type regions when connected to a cathode and an anode, respectively.

Whilst the n-type region is typically formed on a substrate, alternatively, the n-type region may itself be a freestanding substrate suitable for the growth of subsequent crystalline layers. In an example, the substrate is a sapphire substrate. In further examples, the substrate is a silicon substrate, or GaN substrate.

The epitaxial structure 100 is grown using an MOCVD reactor. Advantageously, such structures 100 can be optimised for MOCVD growth and provide high quality growth for efficient generation of light. Additionally or alternatively, other deposition and/or growth methods may be used to provide the epitaxial structure 100, such as MBE.

The n-type region 102 is formed from n-type gallium nitride. However, in further examples the n-type region 102 may be formed from and/or based on other material. The barrier layer 104 is formed from aluminium gallium nitride, for example 10% aluminium AlGaN. However, in further examples, additionally or alternatively, the barrier layer 104 is not used, or may be formed from different materials. The superlattice 108 is formed from gallium nitride based materials. Additionally or alternatively, the superlattice 108 is formed from other materials. The light emitting region 110 comprises at least one quantum well. Additionally or alternatively, the light emitting region 110 comprises further quantum wells. Additionally or alternatively, the light emitting region 110 comprises quantum dots or other quantum structures. The light emitting region 110 is a gallium nitride based region whereby the at least quantum well is formed from a gallium nitride based material such as indium gallium nitride (InGaN), or aluminium indium gallium nitride (AlINGaN). Additionally or alternatively, different materials are used, depending on the structure that is to be grown. The composition of quantum wells in the light emitting region 110 is determined based on the primary peak wavelength that is selected for emission from the light emitting region 110. The barrier layer 112 is formed from aluminium gallium nitride. Additionally or alternatively, different material may be used to form the barrier layer 112. The light emitting region 110 does not contain any doping, for example it does not contain silicon doping or magnesium doping through intentional doping of the light emitting region 110 during the growth of the structure 100. In further examples, doping is used in the light emitting region 110 to the extent that it does not affect the carrier injection in order to emit light via the light emitting surface of a pixel defined by a via passing through the light emitting region 110. In further examples, different semiconductor layers are formed, by growth or otherwise in order to provide the necessary base structure for processing monolithic arrays of micro LEDs.

Whilst a particular epitaxial structure 100 is shown at FIG. 1A, the skilled person understands that additional layers, the exclusion of layers and alternative layers may be used in order to implement the concepts described herein, depending on the particular needs of the specific implementation. The description of layers formed on top of other layers indicates a positional relation in respect of the order of the growth of the layers and does not necessarily preclude the presence of layers in between a first layer and a second layer that is described as being on top of the first layer.

Once the epitaxial structure 100 has been provided, it can be processed in order to provide conducting regions through which carriers can be injected into the eventual structure.

Accordingly, FIG. 1B shows a processed epitaxial structure 100'. There is show the epitaxial structure 100 of FIG. 1A, with an additional mask layer 114. The mask layer 114 is formed and processed using known techniques, including lithographical techniques, in order selectively to create apertures and expose portions of the underlying epitaxial structure 100, for example the barrier layer 112. Once portions of the mask layer 114 have been selectively removed, selective etching of the underlying epitaxial structure 100 is performed. Such selective etching provides vias in the epitaxial structure 100. The vias are created by removal of material in order to leave pathways through the remaining material. Depending on the shape of the area exposed in the mask layer 114 and the depth of the etching, the vias that are formed will have a corresponding form which, in an example, is that of a trench via or a columnar via. Whilst vias are created by etching material to leave trenches, holes or other pathways, in further examples, vias are additionally or alternatively created by forming materials such that the absence of material, as opposed to the removal of material, creates the via structures within the other structures.

In an example the mask layer 114 is silicon nitride. Additionally or alternatively, different material is used, such as silicon dioxide. Advantageously, silicon nitride is an effective and controllable mask layer 114 for subsequent processing steps.

FIG. 1C shows a further processed epitaxial structure 100'', with vias 115 that have been etched through the epitaxial structure 100. The vias 115 are shown to have been etched through the epitaxial structure 100 to the n-type region 102. In order to etch the vias 115, lithographical techniques are used in order to pattern a mask layer and to open apertures in the mask layer to enable the etching of the material exposed by the apertures formed in the mask. The vias 115 are shown in cross-section. In plan view the vias 115 are formed in a grid structure (e.g., see the grid of FIG. 2B), in order to define pixels, where the vias define the perimeter of a light emitting surface of each individual pixel 208 by passing through the light emitting region 110 in order to form a trench via 115 isolating each individual pixel. The width 210 of a pixel 208 is the distance between the vias 115 shown in FIG. 1C.

Once the vias 115 have been formed in the epitaxial structure 100, selective overgrowth of n-type material is formed. Such overgrowth, or deposition, of material in vias 115 can be made with the mask layer 114 remaining in place, such that no growth occurs on the barrier layer 112, for example. Accordingly, FIG. 2A shows a cross sectional view of a processed epitaxial structure provided in FIG. 1.

In an example, the vias 115 are formed using dry etching techniques, such as plasma based techniques. Preferably, wet etch treatment is used in order to recover any damage caused by the etching of the vias 115. Additionally or alternatively, any suitable etching technique is used in order to form vias 115.

Figure 2A:
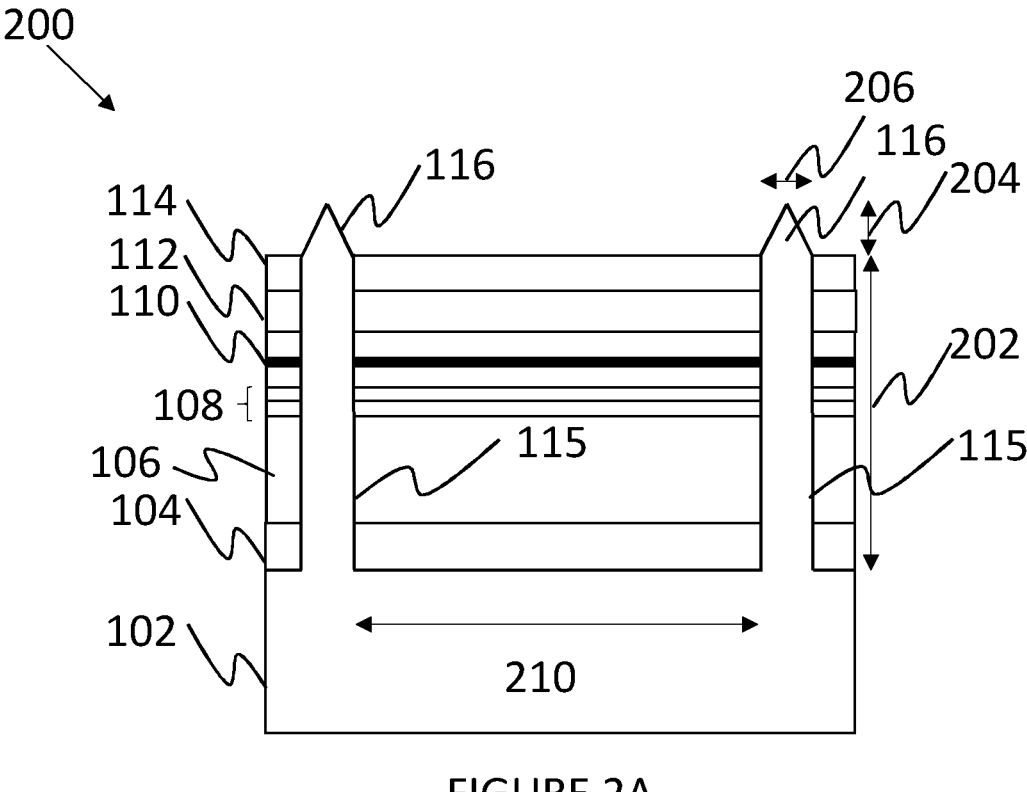
FIG. 2A shows a cross sectional view of a processed epitaxial structure.

FIG. 2A shows the same basic structure 100, 100', 100'' as shown in FIGS. 1A, 1B and 1C, however, the structure 200 of FIG. 2A is shown to have been processed further. The processed epitaxial structure 200 of FIG. 2A illustrates the deposit mask layer 114 which in an example is a silicon nitride layer, which has been etched through in order to provide vias 115, as shown in FIGS. 1A to 1C. The vias 115 have been vertically etched through the epitaxial structure 100 to the doped n-type region 102. Subsequently, n-type overgrowth 116 of n-doped GaN (n-GaN) has been formed in the vias 115 to provide a conducting region that passes through the light emitting region 110.

Whilst a single pixel cross section (with width 210) is shown in FIG. 2A, it is understood that selective etching of the epitaxial structure 100 and overgrowth of n-type material in via trenches provided by the selective etching will result in an n-type grid that is a effectively a common electrode (in this case a cathode) for all of the pixels defined by the n-type overgrowth 116 passing through the light emitting region 110 of the epitaxial structure 100. Advantageously, selective area growth of n-type material is performed using a metalorganic chemical vapour deposition (MOCVD) reactor that uses relatively high temperatures. Such relatively high temperatures anneal defects and passivate any open MQW surface. No dangling bonds in the MQW perimeter are left after processing and hence no passivation is needed. Therefore, beneficially, much reduced non-radiative recombination is achieved in the light emitting region 110.

The n-type overgrowth 116 is shown to be proud of the surface of the masked layer 114. Advantageously, this enables contacting of the doped overgrowth. The structure 200 is not shown to scale, however, in an example the structure formed on the n-type region 102 may be approximately 300 nm in thickness 202, with the n-type overgrowth 116 extending a further 700 nm in height 204 beyond the thickness 202 of the epitaxial structure 200. In an example, the via 115 may be approximately 800 nm in width 206. In further examples the size of structures is determined by the techniques used and structure that is desired, for example. For example, the crystal habit of the material used may determine the growth shape of the material proud surface of any masked layer. By etching through apertures that have been exposed in the masked layer 114 a grid may be formed by growing n-type material in the via 115, as shown in FIG. 2B.

Figure 2B:
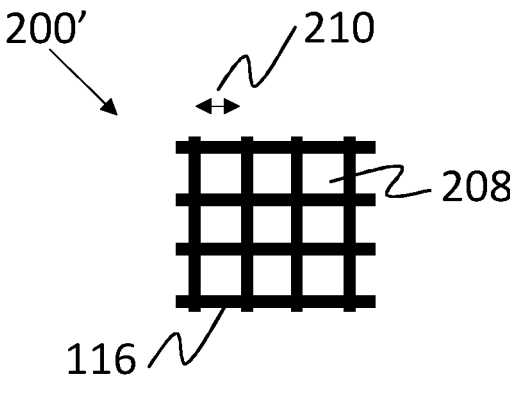
FIG. 2B shows a plan view including the processed epitaxial structure of FIG. 2A.

FIG. 2B shows a plan view 200' of the corresponding structure 200 shown in FIG. 2A. The plan view 200' shows more pixels 208 than shown in FIG. 2A. The skilled person understands that the number of pixels 208 formable by the method described herein is not limited to the number of pixels 208 shown in FIG. 2B and that FIG. 2B shows an exemplary portion of a plan view 200' of vias 115 etched through an epitaxial structure with n-type overgrowth 116 in the vias 115. The grid structure is used to form a common electrode, such as a common cathode, using n-type overgrowth 116. The grid can be used to define pixels 208 (only one of the pixels is labelled, however, it is clear that the matrix formed by the trench vias 115 with n-type region overgrowth is used to define multiple pixels 208) where the light emitting surface of each pixel 208 is shown as the area in the plan view 200' of the square pixels 208 defined by the selectively etched vias 115 formed in a grid matrix with n-type overgrowth 116 in the vias 115. Whilst vias are created by etching material to leave trenches, holes or other pathways, in further examples, vias are additionally or alternatively created by forming materials such that the absence of material, as opposed to the removal of material, creates the via structures within the other structures.

In an example the width 210 of pixel 208 is approximately 3 μm. The width 210 of pixel 208 is preferably selected based on the carrier diffusion length that is used to enable efficient light emission from the light emitting surface of pixel 208. Advantageously, as the electrode that is formed by the n-type overgrowth 116 runs around the perimeter of each pixel 208, passing through the light emitting region 110, no further electrical isolation of the pixel 208 is needed. In further examples, the light emitting surface of each pixel 208 is less than 100 microns squared. In yet further examples, the light emitting surface of each pixel 208 is less than 16 microns squared. Whilst the pixels 208 are shown to have the same size and shaped light emitting surface, in further examples an array is provided with different pixels of different shapes and/or sizes.

Once an effective cathode provided by the n-type overgrowth 116 in the via 115 has been provided, an anode is provided based on p-type overgrowth 118 formed in a further via 117.

Figure 3A:
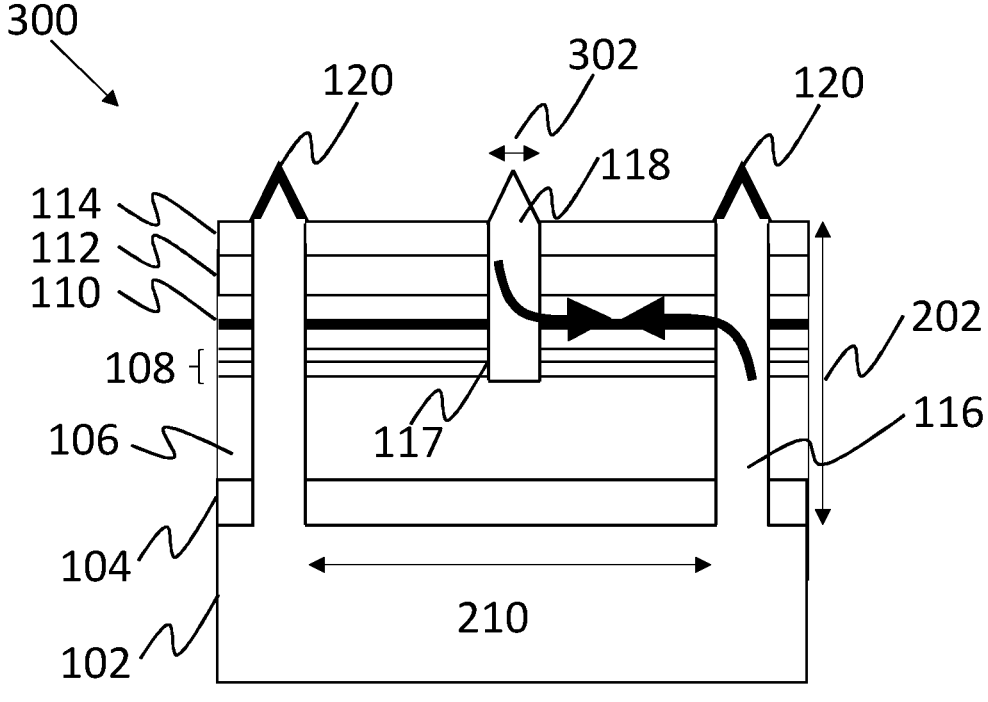
FIG. 3A shows a cross sectional view of a light emitting structure.

FIG. 3A shows the structure 200 of FIG. 2A that has been further processed in order to provide a light emitting structure 300. There is shown n-type overgrowth 116 in vias 115 passing through the light emitting region 110 to the n-type region 102. There is also shown a via 117 passing through the light emitting region 110, whereby p-type overgrowth is 118 is formed in the further via 117. This is achieved by depositing a further mask layer (shown as mask layer 120 on the n-type overgrowth 116 and adding to the mask layer 114) onto the mask layer 114 of FIG. 2A, selectively patterning the further mask layer 120 and mask layer 114 in order to create apertures to expose the underlying structure and etching through the mask layers 114, 120 down to the active region provided by the light emitting region 110 using known lithographic and etching techniques. As described with respect to the creation of vias 115 for n-type overgrowth 116, the vias 117 for p-type overgrowth 118 are formed using dry etching techniques. In an example, wet etch treatment is used in order to recover damage caused by the dry etch, where necessary.

The further via 117 is a columnar via formed centrally within the pixel perimeter defined by the via 115 that has been formed through the light emitting region 110. Additionally or alternatively, the further via 117 is located at any suitable position in order to provide light emission. The cross sectional shape of the further via 117 when seen in plan view is determined by the patterning and etching steps that are used in order to provide the further via 117. The via 117 has a width of approximately 800 nm. In further examples, the via 117 has a width sized to meet preferred implementations regarding carrier injection and arrangement of pixels.

As shown by the arrows, in FIG. 3A, from the n-type overgrowth 116 and the p-type overgrowth 118 into the light emitting region 110, the n-type overgrowth 116 provides an effective cathode and the p-type overgrowth 118 provides an effective anode, thereby to allow lateral injection of carriers into the light emitting region 110 when a suitable power source is used. Such lateral carrier injection in the light emitting region 110 provides more efficient carrier injection, including more efficient hole injection, and hence more efficient light emission. The carrier injection into the light emitting region 110 may be based on the carrier diffusion length of the carriers injected into the multiple quantum well structure of the light emitting region 110 to provide light that can be emitted via a light emitting surface defined by the pixel perimeter formed by the n-type overgrowth 116 in the vias 115 etched through the light emitting region 110. A plan view 300' of the light emitting structure 300 is shown at FIG. 3B.

Figure 3B:
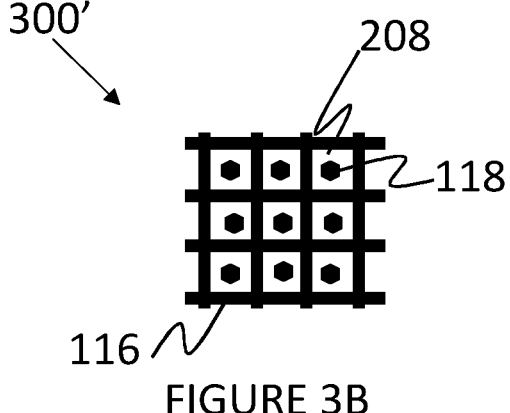
FIG. 3B shows a plan view including the light emitting structure of FIG. 3A.

FIG. 3B shows the n-type overgrowth 116 formed in grid vias 115 etched through the structure 100 as described with respect to FIG. 1A. Further, p-type overgrowth 118 formed in central vias 117 in the pixels 208 defined by the n-type overgrowth 116 in the vias 115 of the common electrode provided by the n-type overgrowth 116 is shown. In an example, the central vias 117 are formed in each of the pixels 208 that are to be addressed. The p-type overgrowth 118 is shown in centrally positioned vias 117 in each of the pixels 208. Such an arrangement of a common n-type region that can form a common cathode electrode and individual columnar p-type overgrowth regions that can form independently addressable anode electrodes can be used in order to energise individual pixels 208 in a monochromatic high resolution micro LED array.

Advantageously, compared with known selective area growth techniques, only n-type and p-type regions may be overgrown. This eliminates issues associated with poor uniformity and composition pulling that is normally encountered when growing AlGaN and InGaN alloys on patterned surfaces.

Whilst vias 115 forming trenches defining the light emitting surfaces of pixels 208 by passing through the light emitting region 110 of epitaxial structures is shown based on etching of epitaxial structures, in further examples, other techniques are used to form light emitting regions with vias passing through them in order to define the perimeters of light emitting surfaces of pixels in an array of pixels.

Figure 4:
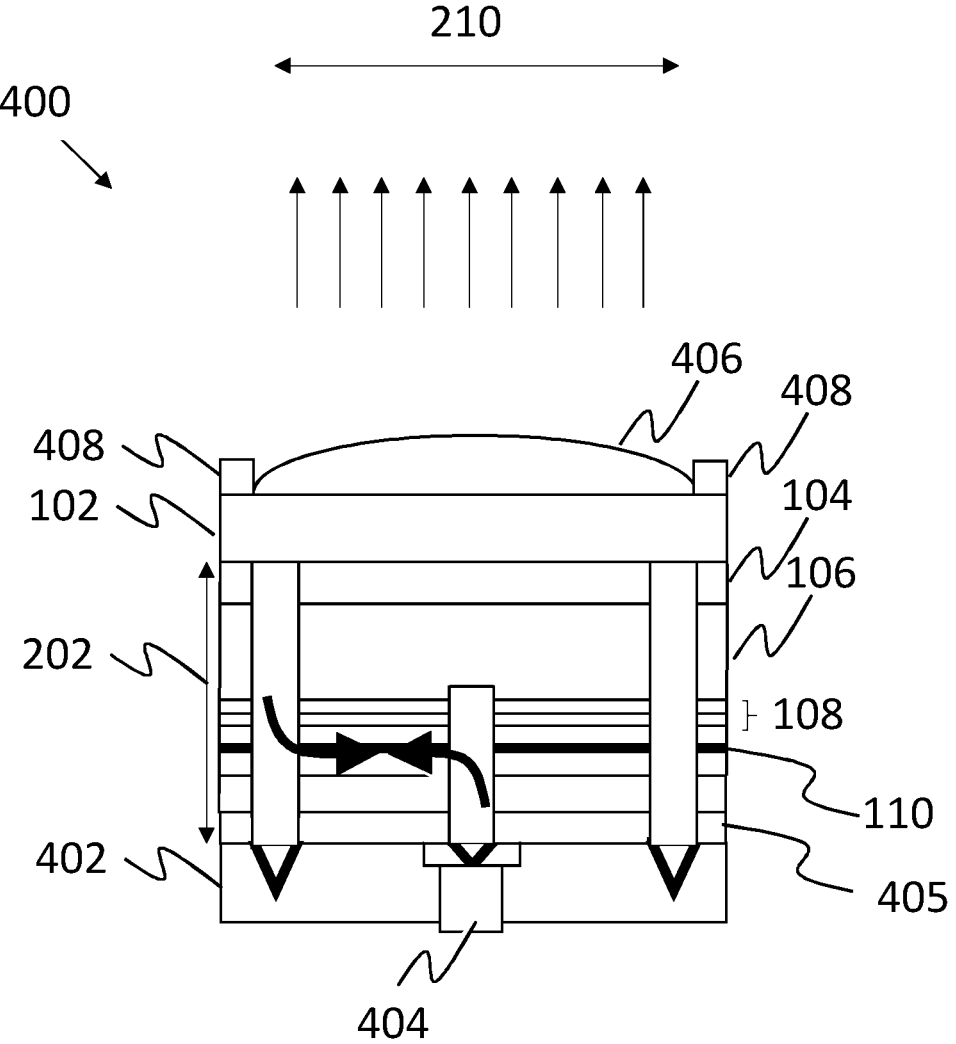
FIG. 4 shows a cross sectional view of a processed light emitting structure.

FIG. 4 shows a cross-sectional view of a processed light emitting structure as described with respect to FIGS. 1 to 3. The processed light emitting structure 400 is provided by flipping the light emitting structure of FIG. 3A in order to extract light through the n-type region 102 and thus avoid absorption due to the p-type contact 404 (arrows in FIG. 4 show the direction of light from the light emitting surface of a pixel 208 defined by vias 115 passing through the light emitting region 110).

Further, FIG. 4 shows an insulating layer 402. The insulating layer 402 insulates the n-type overgrowth 116 such from any connections used to contact the p-type overgrowth. Preferably, the insulating layer is silicon dioxide. There is shown a contact 404 to which the anode of each pixel 208 that is to be addressed is connected. Additionally, there is shown a mirror/barrier layer 405 configured to reflect light emitted from the light emitting region 110 out of a light emitting surface defined by the n-type overgrowth 116 in the vias 115 defining the perimeter of the pixels 208. Advantageously, the contact 404 may be connected to a backplane such that a contact 404 for each pixel in an array is contacted and independently addressable.

There is shown a metal grid 408 designed to contact to the common cathode n-type grid of the light emitting array. Such a metal 408 grid is aligned with respect to the n-type overgrowth 116 in the vias 115 in order to maximise light extraction and thus when viewed in plan view may assume substantially the same form as the grid provided by the vias 115 etched through the light emitting region 110 of an epitaxial structure 100.

There is also shown a transparent conducting layer 406, which may preferably be Indium Tin Oxide (ITO), formed around and/or between the conducting metal grid 408 in order to provide conduction and efficient light extraction from the pixel 208 of the light emitting array of micro LEDs.

Whilst cross-sectional views of individual pixels are shown in FIGS. 1 to 4, the skilled person understands that each pixel forms part of an array of pixels. Whilst the array is shown as a grid with square shaped pixels (e.g., in FIGS. 2B and 3B), in further examples different shaped pixels may be provided by etching different patterns through the epitaxial structure shown at FIG. 1, for example.

Whilst the concept of a template to provide a grid of vias passing through a light emitting region and defining pixels using an n-GaN n-type region 102 with centrally etched vias 117 with p-type overgrowth 118 provided by p-GaN is shown, in further examples, different implementations of the concept are possible, some of which are described in with respect to the following figures.

For example, monolithic high resolution micro LED arrays with vias defining pixels might be provided using different structures that use lateral carrier injection or carrier diffusion into quantum structures.

Figure 5:
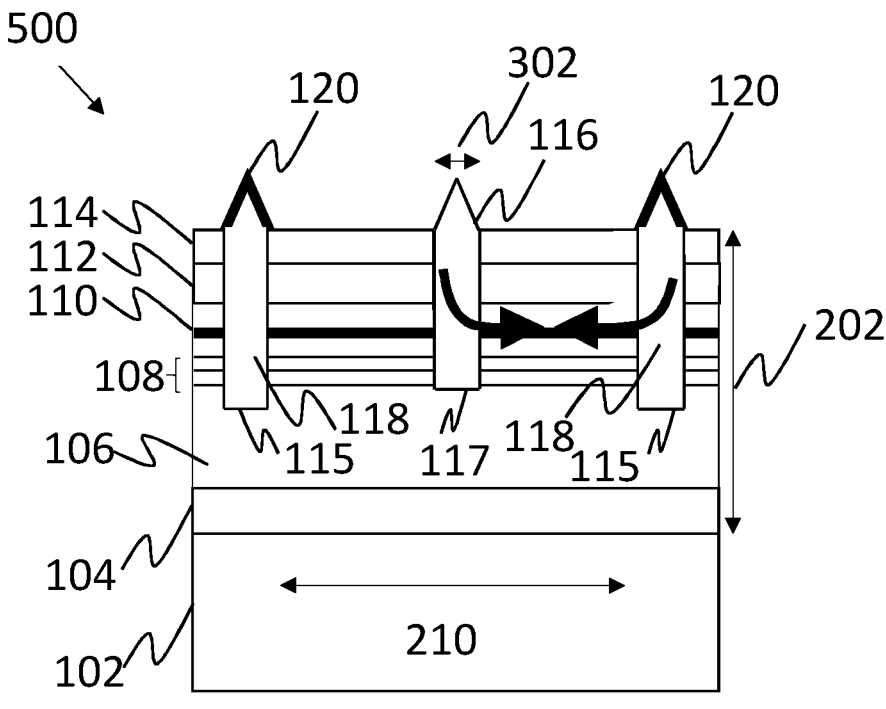
FIG. 5 shows a cross sectional view of a light emitting structure.

FIG. 5 shows a cross sectional view of a light emitting structure 500 in accordance with the above described concept (where one pixel of a pixel array is defined and the same nomenclature is used in order to draw parallels between the pixels 208 with a pixel width 210 illustrated in FIG. 2B, for example). There is shown the same epitaxial structure 100 described with respect to FIG. 1. However, instead of etching through the masked layer 114 in order to form vias 115 that connect with the n-type region 102, there are shown vias 115 etched through the light emitting region 110, the vias 115 terminating in the undoped region 106, in order to provide trenches for p-type overgrowth 118. P-type overgrowth 118 in these trench vias 115 is used to provide a common anode grid passing through the light emitting region 110 that defines pixels 208. In a complementary method to that described with respect to FIGS. 1 to 4, a cathode can be provided in each pixel 208 by etching through a central via 117 and depositing/growing n-type overgrowth 116 material in the via 117. Patterning and etching steps are implemented depending on the specific structure that is to be produced and may use known techniques.

Figure 6:
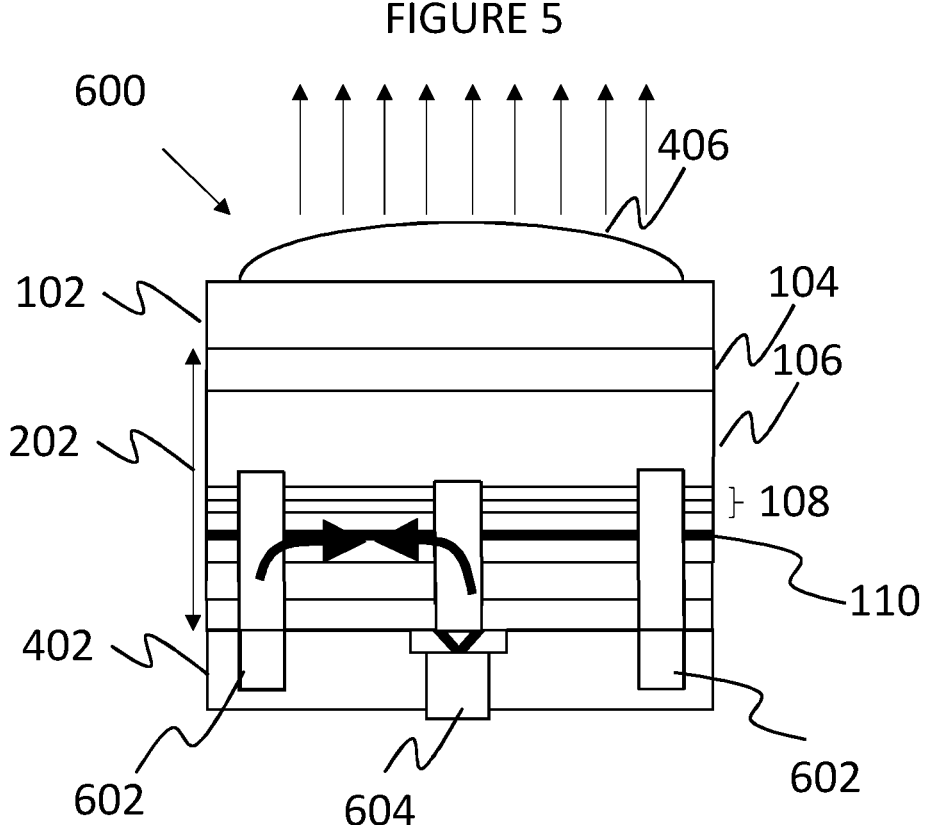
FIG. 6 shows a cross sectional view of processed a light emitting structure.

FIG. 6 shows a processed light emitting structure 600 based on the light emitting structure 500 described with respect to FIG. 5. The processed light emitting structure 600 is a flipped structure with respect to that of FIG. 5, where light is intended to be extracted via a light emitting surface defined by the p-type via grid, but through the n-type region 102 (the arrows show the direction of light out of the structure, and in three dimensions would be understood to illuminate a pixel 208 in such a way that the light emitting surface of the pixel 208 that has its perimeter defined by the vias 115 passing through the light emitting region 110). A common anode grid 602 is provided in order to make contact with the p-type overgrowth 118 in the vias 115 etched through the light emitting region 110. A contact 604 is formed to enable carrier injection in the n-type overgrowth 116 of the cathode for each light emitting pixel that is to be addressed. The contact 604 may be reflective in order to enhance light extraction from the light emitting structure 600. The structure may be planarized such that a planarized insulator layer 402 provides a surface to which a backplane might connect to contact 604 and other contacts 604 in other pixels 208 such that each pixel 208 might be individually addressed.

Figures 7, 8:
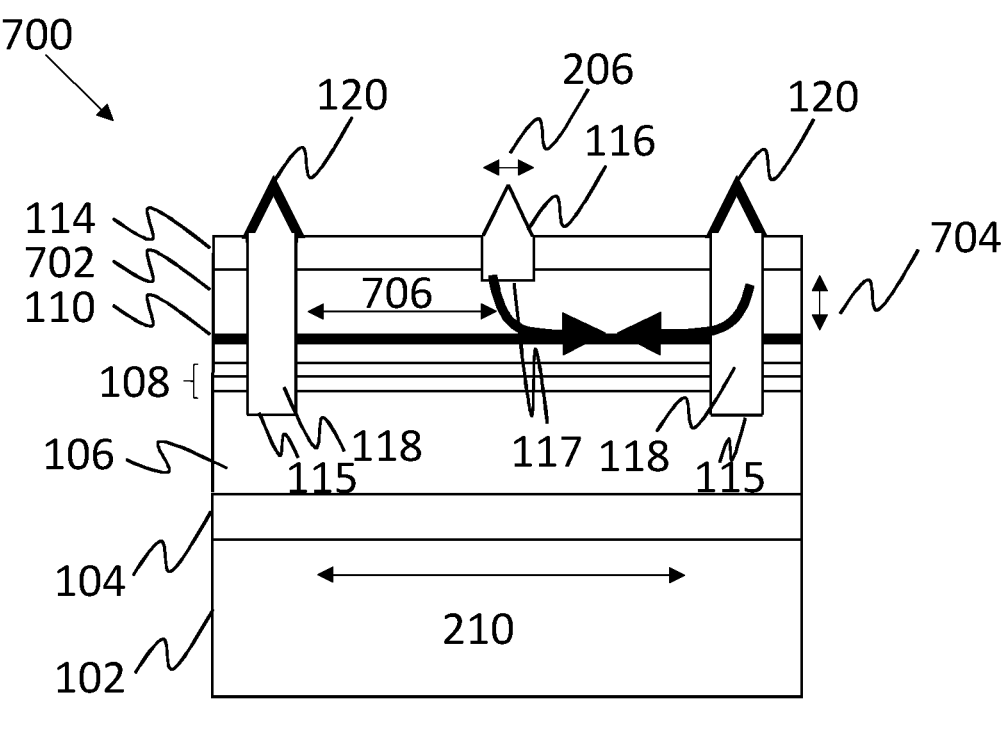
FIG. 7 shows a cross sectional view of a light emitting structure.
FIG. 8 shows a cross sectional view of a light emitting structure.

FIGS. 7 and 8 show light emitting structures as described with reference to FIGS. 1 to 4, but without the further via 117 passing through the light emitting region 110. There is shown an undoped region 702 separating the light emitting region 110 from the central overgrowth 116, 118 of a patterned and doped region. FIG. 7 shows a light emitting structure 700 with p-type overgrowth 118 in vias 115 defining a pixel 208 and central n-type overgrowth 116, 118. FIG. 8 shows a light emitting structure 800 with n-type overgrowth 116 in vias 115 defining a pixel 208 and p-type overgrowth 118. Appropriate selection of dimensions for the structures of FIGS. 7 and 8 results in carrier diffusion into the light emitting region 110. For example if the order of the vertical distance 704 from the central doped region to the light emitting region 110 is of the order of 10 s of nanometres and the lateral distance 706 between the n-type overgrowth 116 and the p-type overgrowth 118 is of the order of 100 s of nanometres, recombination in the quantum structures of the light emitting region 110 is feasible.

Whilst a monochromatic high resolution micro LED array has been described above, it is possible to provide a multi colour high resolution micro LED array based on etching through multiple light emitting regions, as described here.

Figure 9:
FIG. 9 shows a cross sectional view of an epitaxial structure having three different light emitting regions.
Figure 9:

FIG. 9 shows an epitaxial structure 900. The epitaxial structure 900 is provided in a similar manner to the epitaxial structure 100 described with reference to FIG. 1. However, rather than having one light emitting region 110 arranged to emit light with a peak primary wavelength, the structure 900 has three light emitting regions. There is shown a superlattice 906 upon which a light emitting region 907 is provided. Upon light emitting region 907 there is provided an undoped region 902, followed by a second superlattice 908 and a second light emitting region 909. Upon the second light emitting region 909 there is provided a further undoped region 904 and a third superlattice 910, followed by a third light emitting region 911. The undoped regions 902, 904 are understood to provide recovery layers whereby V-pits that are generated at the level of the corresponding superlattice layers 906, 908, 910 are filled up and a smooth surface is achieved. The first light emitting region 907 is configured to emit a primary peak wavelength that is different from the primary peak wavelength that the second light emitting region 909 is configured to emit, which is in turn different from the primary peak wavelength that the third light emitting region 911 is configured to emit. The first light emitting region 907 is configured to emit blue light, the second light emitting region 909 is configured to emit green light and the third light emitting region 911 is configured to emit red light. This structure 900, which typically has a thickness 912 between 600 nm and 800 nm is an epitaxial structure 900 that forms the basis for processing (which can include further growth steps) in order to provide a monolithic high resolution RGB micro LED array. Whilst the epitaxial structure 900 is shown to include superlattice layers 908, 910 and recovery layers 902, 904, in further examples, alternatively, the structure 900 may be thinner by omitting one or more of the superattice layers 908, 910 and one or more of the recovery layers 902, 904. Beneficially, in such cases the blue, green and red emitting layers are separated by thinner quantum barriers of the order of 5 nm to 20 nm and the full structure 900 may be just 100 nm to 200 nm thick.

Beneficially, the structure 900 is formed in one growth process. Advantageously, the structure 900 is formed such that the light emitting regions 907, 909, 911 are relatively closely spaced, vertically (as demonstrated by the thickness 912, which includes the light emitting regions 907, 909, 911, and also superlattice structures and undoped recovery layers), and hence subsequently, shallow etches can be used to etch through and remove light emitting regions 907, 909, 911 where certain of the light emitting regions 907, 909, 911 are considered superfluous. This proves particularly beneficial in the following processes for providing a high resolution monolithic colour array of micro LEDs. Whilst the light emitting regions 907, 909, 911 each comprise MQWs, in further examples, light emitting regions additionally or alternatively comprise single quantum wells in each light emitting region. In further examples, the light emitting regions additionally or alternatively comprise quantum barrier layers between a single quantum well of each of the light emitting regions. Advantageously, the use of thins layers with small separations facilitates shallow etching, for example using suitable techniques such as atomic layer etching, of different regions of the structure 900 to provide different light emitting surfaces for the emission of different wavelengths of light. Beneficially, shallow etches result in reduced differences in heights between pixels and a gentler topology, thereby aiding further processing of the structure.

Figures 10A, 10B:
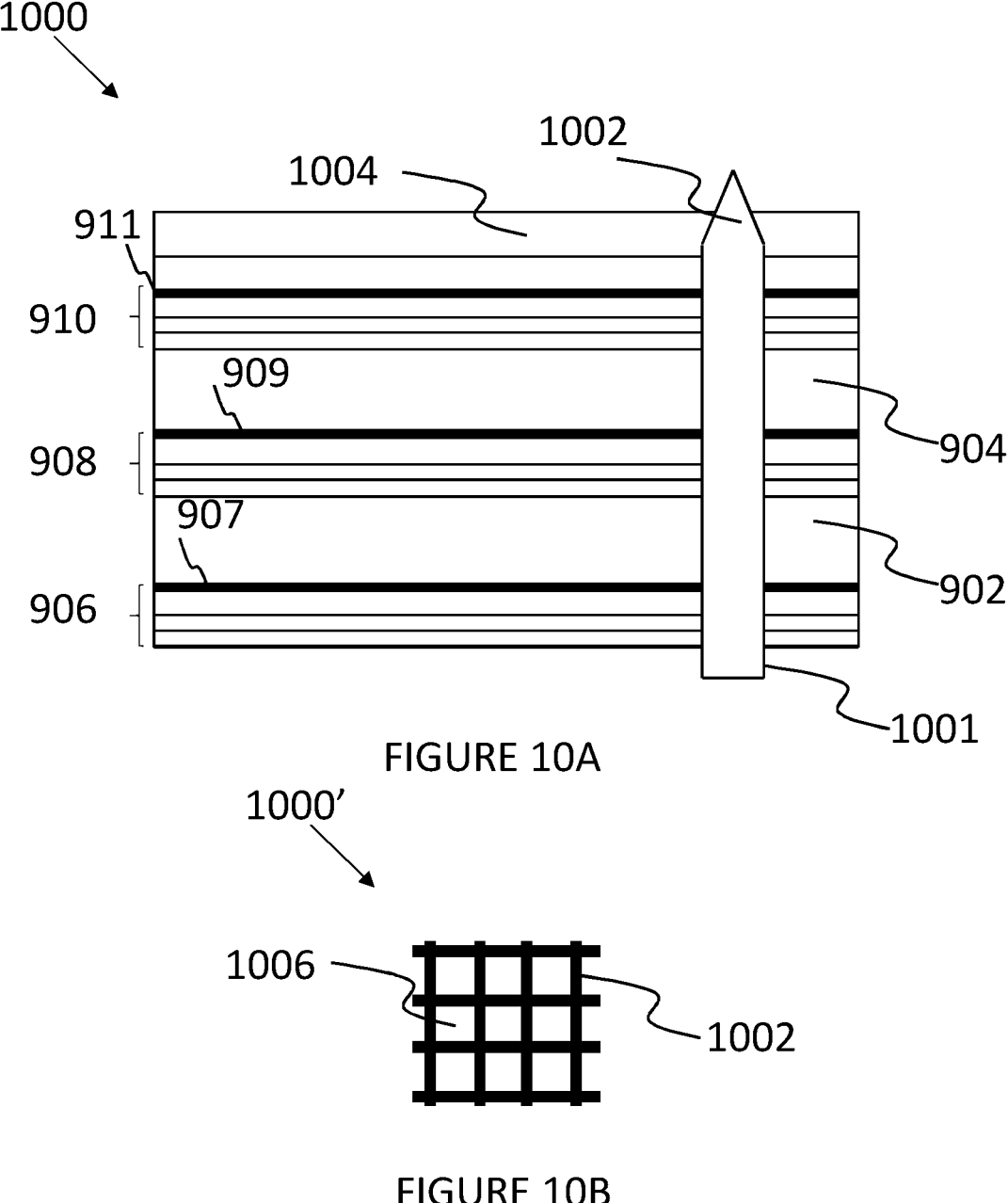
FIG. 10A shows a cross sectional view including the processed epitaxial structure of FIG. 9.
FIG. 10B shows a plan view of the processed epitaxial structure of FIG. 10A.

The epitaxial structure 900 of FIG. 9 is processed in a similar way to the epitaxial structure 100 of FIG. 1 in order to provide the processed structure 1000 of FIG. 10A. FIG. 10A shows a mask layer 1004 deposited onto the epitaxial structure 900 and patterned using lithographical techniques in order to expose the underlying epitaxial structure 900 to enable selective etching through the epitaxial structure 900 and, in particular, through the three light emitting regions 907, 909, 911. Selective etching (typically using dry etching techniques) through the epitaxial structure 900 provides vias 1001 that can be filled by forming an n-type overgrowth 1002 region in the vias 1001. The vias 1001 and the n-type overgrowth 1402 in the vias 1001 passes through the light emitting regions 907, 909, 911 to define the perimeters of individual pixels. This is demonstrated in the plan view 1000' of FIG. 14B, which shows pixels 1006 (only one labelled) surrounded by n-type overgrowth 1002 formed in trench vias 1001 and effectively providing a common electrode for the pixels 1006. As shown in FIGS. 10A and 10B, the pixels defined with trench vias 1001 passing through the light emitting regions 907, 909, 911 each has three different light emitting regions 907, 909, 911. Therefore, in order to provide an RGB array, the pixels are selectively etched in order to remove undesired wavelengths in particular pixels. This is demonstrated with reference to FIGS. 11A and 11B.

Figures 11A, 11B:
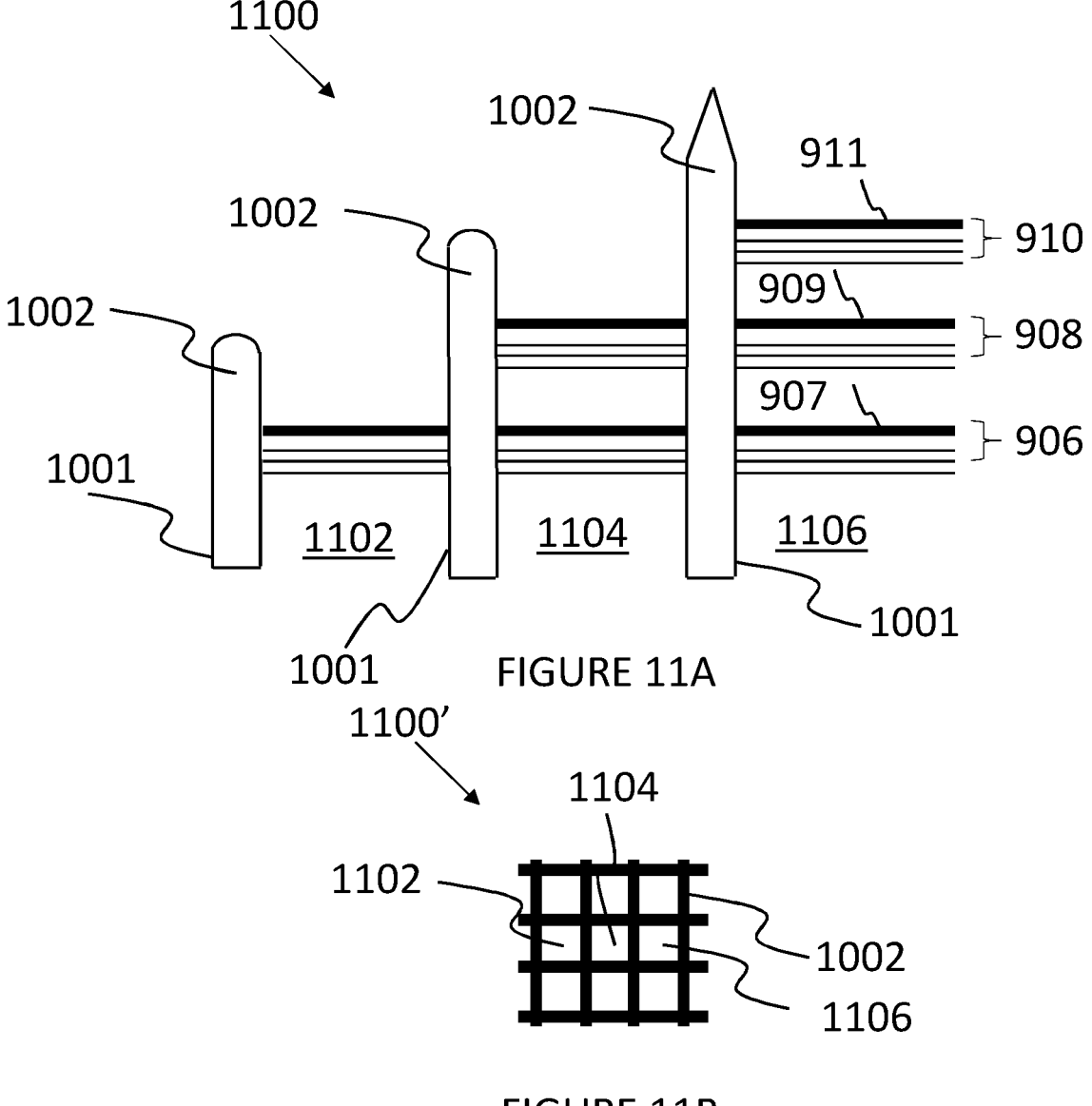
FIG. 11A shows a cross sectional view of the further processed epitaxial structure of FIG. 10A.
FIG. 11B shows a plan view including the further processed epitaxial structure of FIG. 11A.

FIG. 11A shows how the unwanted longest wavelength is locally removed in order to leave the light emitting region desired for each individual pixel. There is shown in processed epitaxial structure 1100 of FIG. 11A the n-type overgrowth 1002 forming a common grid cathode passing through all of the light emitting regions 907, 909, 911. In a first pixel 1102, the green second light emitting region 909 and the red third light emitting region 911 have been etched away in order to leave the blue, first light emitting region 907. In a second pixel 1104, the red, third light emitting region 909 has been etched away in order to leave the blue, first light emitting region 907 and the second, green, light emitting region 909. In a third pixel 1106, none of the light emitting regions 907, 909, 911 have been removed and therefore all remain. Each of the pixels 1102, 1104, 1106 is defined by the vias 1001 etched through the epitaxial structure 900 and in particular through the light emitting regions 907, 909, 911.

Figure 12B:
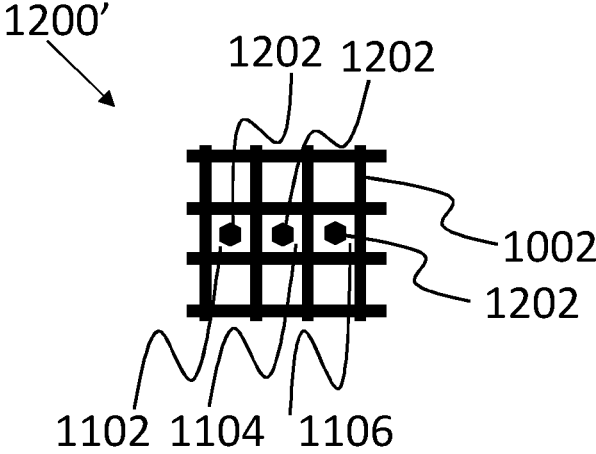
FIG. 12B shows a plan view of the light emitting structure of FIG. 12A.

FIG. 11B shows how selective etching of the light emitting regions 907, 909, 911 results in pixels dedicated to emitting different wavelengths. For example, the first pixel 1102 can be contacted in order to emit blue light. The second pixel 1104 can be contacted in order to emit green light. The third pixel 1106 can be contacted in order to emit red light. A high resolution monolithic red-green-blue light emitting micro LED array can be formed by selectively dedicating pixels to particular primary peak wavelength emissions. As described above, whilst the light emitting regions 907, 909, 911 each comprise MQWs, in further examples, light emitting regions additionally or alternatively comprise single quantum wells in each light emitting region. In further examples, the light emitting regions additionally or alternatively comprise quantum barrier layers between single quantum wells in each of the light emitting regions. Advantageously, the use of thins layers with small separations facilitates shallow etching of different regions of the structure 900 to provide different light emitting surfaces for the emission of different wavelengths of light. Beneficially, shallow etches result in reduced differences in heights between pixels 1102, 1104, 1106 and a gentler topology, thereby aiding further processing of the structure as described at least with respect to FIGS. 12A and 12B.

FIG. 12A shows a thin and conformal mask layer 1204 that is patterned and opened in order to expose central holes in each pixel 1102, 1104, 1106. Once central holes have been exposed (using lithographical techniques) in each of the pixels 1102, 1104, 1106, the epitaxial structure 900 can selectively be etched in order to provide vias 1201 in which p-type overgrowth 1202 is formed. As the locally longest wavelength light emitting region has been removed, the selective etch passes into the light emitting region of the desired wavelength for each pixel. Advantageously, the creation of the structure and the processing of the structure are arranged in order to minimise the number of processing steps to form the resultant structure. This is demonstrated in FIG. 12B, which shows plan view 1200' of an array with p-type overgrowth 1202 forming a central via in each of the pixels 1102, 1104, 1106.

In a similar manner to that described above with respect to the monochromatic monolithic high resolution micro LED array, the processed light emitting structure 1200 can be flipped and further processed in order to connect with a backplane for control of individual pixels. FIG. 13A shows a cross sectional view of a light emitting array 1300 with three different colour pixels. There is shown the first pixel 1102, configured to emit light with a primary peak wavelength that is blue, the second pixel 1104, configured to emit light with a primary peak wavelength that is green and the third pixel 1106, configured to emit light with a primary peak wavelength that is red.

Carrier injection into each of the pixels 1102, 1104, 1106 occurs laterally, as demonstrated in FIG. 13B. Whilst the high resolution RGB micro LED array is described with reference to a common cathode formed with n-type overgrowth formed in vias defining the perimeter of pixels and p-type overgrowth forming central vias in each individual pixel for back plate connection, the skilled person understands that alternative implementations, for example those described with reference to the high resolution monochromatic micro LED array can be applied to the high resolution RGB micro LED array. Further, the skilled person understands that, whilst the example shown with respect to FIGS. 9 to 13 shows the formation of vias 1001 defining pixel perimeters by passing through the light emitting regions 907, 909, 911, with n-type overgrowth 1002 in the vias 1001 and central vias 1201 in each pixel with p-type overgrowth 1202 formed in the vias 1201, in further examples different implementations are used (for example, the use of p-type growth 1202 in vias 1001 defining light emitting surfaces of pixels with n-type growth 1002 in central vias 1201, or using any of the implementations described with respect to FIGS. 1 to 8).

Whilst the above describes pixels with a light emitting surface defining a pixel, where the pixel perimeter is defined by a via passing through one or more of the light emitting regions, such that the a pixel is configured to emit light with a primary peak wavelength, in an example, for a multicolour structure, a common via is formed through multiple light emitting regions and portions of the light emitting surface defined by the via forming the perimeter are selectively etched in order to form contacts, using overgrowth, as described above, such that a plurality of different primary peak wavelengths might be emitted from a pixel. This is demonstrated in FIG. 14, which shows a plan view 1400 of a triad of micro LEDs defined by a overgrowth 1002 formed in a via, as described above with reference to FIGS. 9 to 13. A cross sectional view 1400' of the structure shown in plan view 1400 is shown in accordance with the diagonal dotted line. A cross sectional view 1400" of the structure shown in plan view 1400 is shown in accordance with the horizontal dotted line. Like features shown in plan 1400 and cross sectional views 1400', 1400", illustrate how such a structure is implemented. Advantageously, such a structure enables tighter integration of micro LEDs.

Advantageously, by using the above described structures and methods, monolithic arrays of high resolution micro LEDs are provided. Such arrays can include monochromatic or multi-coloured arrays and are thus applicable to a multitude of applications requiring high resolution light emitting structures. Beneficially, the pixel pitch of such monolithic high resolution micro LED arrays is less than 10 microns. In some examples, the pixel pitch of such monolithic high resolution micro LED arrays is less than 4 microns. In further examples, the pixel pitch of such monolithic high resolution micro LED arrays is less than 3 microns. Whilst arrays are described with respect to square pixels in a grid formation, other formations and patterns of pixels in arrays are implemented in further examples.

High quality emissive arrays are formed at least in part due to the use of a planar epitaxial structure that is formed (grown or provided) and processed with minimal overgrowth in order to isolate pixels in a tightly integrated array. Beneficially, the vias passing through the light emitting region of the epitaxial structure provide means for improved electrical contact for all of the pixels in the array, where the pixels can be independently driven. Advantageously, the provision of a stack of light emitting regions means that the desired light emitting regions can be identified and their surface exposed for efficient processing and contacting in order to provide improved light emitting diode structures and monolithic high resolution micro LED arrays.

Whilst the above LED structures are described with reference to growth by MOCVD, growth by different and/or supplementary techniques is beneficial in some examples. For example, growth by MBE may enable cooler and/or slower growth rates which may have benefits in respect of the above described growth and processing steps. Whilst the above process steps are described in any order, the skilled person understands that in further examples the process steps are performed in any order that is suitable to obtain the target structure.

What is claimed is:

1. A light emitting diode structure comprising:
a p-type region;
an n-type region; and
a light emitting region for recombination of carriers injectable by the p-type region and the n-type region, wherein at least one of the n-type region and the p-type region is at least partially formed in a via passing through the light emitting region, wherein the via defines the perimeter of a light emitting surface of at least one pixel.

2. The light emitting diode structure of claim 1, wherein the light emitting region comprises at least one epitaxial quantum well layer and/or wherein the via enables lateral carrier injection in the light emitting region.

3. The light emitting diode structure of claim 1, wherein both the n-type region and the p-type region are at least partially formed in vias passing through the light emitting region.

4. The light emitting diode structure of claim 1, wherein the light emitting region and a further light emitting region are separated by an undoped region thereby to provide a stack of light emitting regions, wherein the via passes through both the light emitting region and the further light emitting region, wherein the light emitting region and the further light emitting region are configured to emit light of different wavelengths, wherein the light emitting region and the further light emitting region are arranged such that the surface areas of the light emitting region and further light emitting region partially overlap.

5. The light emitting diode structure of claim 1, wherein the via is a grid via defining an array comprising a plurality of pixels, wherein the grid is arranged to provide a common electrode.

6. The light emitting diode structure of claim 1, wherein the light emitting surface has an area based on the diffusion length of carriers within the light emitting region.

7. The light emitting diode structure of claim 1, wherein the at least one pixel is defined peripherally entirely by a single electrode.

8. A high resolution micro LED array comprising the light emitting diode structure of any of claim 1.

9. The high resolution micro LED array of claim 8, wherein the array is a multi-colour array and wherein the array has a pixel pitch less than 10 microns.

10. A method of forming a light emitting diode structure comprising:
a p-type region;
an n-type region; and
an light emitting region for recombination of carriers injectable by the p-type region and the n-type region, wherein at least one of the n-type region and the p-type region is at least partially formed in a via passing through the light emitting region, wherein the via defines the perimeter of a light emitting surface of at least one pixel,
the method comprising:
growing a plurality of epitaxial layers to form an epitaxial structure, the epitaxial layers comprising the n-type region and the light emitting region;
forming the via in the light emitting region; and
forming, at least partially, one of the n-type region and the p-type region in the via.

11. The method of claim 10 wherein the light emitting region comprises at least one epitaxial quantum well layer and wherein the via enables lateral carrier injection in the light emitting region.

12. The method of claim 10, comprising:
forming both the n-type region and the p-type region in vias passing through the light emitting region, comprising providing a further via, wherein the via and the further via are arranged respectively to provide an anode and a cathode.

13. The method of claim 12, further comprising growing a further light emitting region, wherein the light emitting region and the further light emitting region are separated by an undoped region thereby to provide a stack of light emitting regions, wherein the light emitting region and the further light emitting region are arranged such that the surface areas of the light emitting region and further light emitting region partially overlap.

14. The method of claim 12, comprising growing at least three light emitting regions, wherein one of the light emitting regions emits blue light, one of the light emitting regions emits green light and one of the light emitting regions emits red light.

15. The method of claim 10, wherein the via is a grid via defining a plurality of pixels.

16. The method of claim 10, comprising forming the n-type region and/or the p-type region in the via by selected area growth of n-type material and/or p-type material respectively.

17. The method of claim 10, comprising etching through the light emitting region to form the via.

18. A method of forming a high resolution LED array comprising claim 10.

19. The method of claim 18, wherein the array is a multicolour array, and wherein the array has a pixel pitch of less than 10 microns.

\* \* \* \* \*